(12) United States Patent
Wang

(10) Patent No.: US 11,914,811 B2
(45) Date of Patent: Feb. 27, 2024

(54) DISPLAY SUBSTRATE AND PREPARATION METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventor: Shilong Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 38 days.

(21) Appl. No.: 17/625,087

(22) PCT Filed: Mar. 10, 2021

(86) PCT No.: PCT/CN2021/080032
§ 371 (c)(1),
(2) Date: Jan. 5, 2022

(87) PCT Pub. No.: WO2021/213050
PCT Pub. Date: Oct. 28, 2021

(65) Prior Publication Data
US 2022/0291798 A1 Sep. 15, 2022

(30) Foreign Application Priority Data
Apr. 22, 2020 (CN) .......................... 202010323194.4

(51) Int. Cl.
*G06F 3/041* (2006.01)
*G09G 3/00* (2006.01)
*G09G 3/3275* (2016.01)

(52) U.S. Cl.
CPC ........ *G06F 3/04164* (2019.05); *G06F 3/0412* (2013.01); *G09G 3/006* (2013.01);
(Continued)

(58) Field of Classification Search
CPC ... G06F 3/04164; G06F 3/0412; G09G 3/006; G09G 3/3275; G09G 2300/046
See application file for complete search history.

(56) References Cited

U.S. PATENT DOCUMENTS

2016/0274387 A1    9/2016    Zheng et al.
2017/0064297 A1*   3/2017    Kim ..................... H04N 17/004
(Continued)

FOREIGN PATENT DOCUMENTS

CN      104656292 A    5/2015
CN      107154232 A    9/2017
(Continued)

OTHER PUBLICATIONS

Office Action dated Aug. 10, 2022 for Chinese Patent Application No. 202010323194.4 and English Translation.
(Continued)

*Primary Examiner* — Roy P Rabindranath
(74) *Attorney, Agent, or Firm* — Ling Wu; Stephen Yang; Ling and Yang Intellectual Property

(57) ABSTRACT

A display substrate and a preparation method therefor, and a display device, the display substrate including a base as well as a display area, a binding needle area, a first unit test electrode and a second unit test electrode which are on one side of the base. The binding needle area is on one side of the display area; the first unit test electrode is on the side, away from the display area, of the binding needle area; the second unit test electrode is on the side, away from the binding needle area, of the first unit test electrode; the display substrate comprises a first metal layer, a second (Continued)

metal layer and an insulating layer between the first metal layer and the second metal layer; the first unit test electrode is on the first metal layer, and the second unit test electrode is on the second metal layer.

12 Claims, 3 Drawing Sheets

(52) U.S. Cl.
CPC . *G09G 3/3275* (2013.01); *G06F 2203/04102* (2013.01); *G06F 2203/04103* (2013.01); *G09G 2300/0408* (2013.01); *G09G 2300/0426* (2013.01); *G09G 2330/12* (2013.01); *G09G 2354/00* (2013.01)

(56) References Cited

U.S. PATENT DOCUMENTS

| | | | |
|---|---|---|---|
| 2018/0123089 A1 | 5/2018 | Sumita | |
| 2018/0151100 A1* | 5/2018 | Zhou | H05K 5/0017 |
| 2018/0210305 A1* | 7/2018 | Gao | G09G 3/006 |
| 2019/0229133 A1* | 7/2019 | Li | G09G 3/3266 |
| 2019/0261512 A1* | 8/2019 | Huang | H10K 59/131 |
| 2020/0103693 A1* | 4/2020 | Chen | G02F 1/13452 |

FOREIGN PATENT DOCUMENTS

| | | |
|---|---|---|
| CN | 107331294 A | 11/2017 |
| CN | 109001945 A | 12/2018 |
| CN | 110796949 A | 2/2020 |
| CN | 111490086 A | 8/2020 |

OTHER PUBLICATIONS

International Search Report for PCT/CN2021/080032 dated May 17, 2021.

* cited by examiner

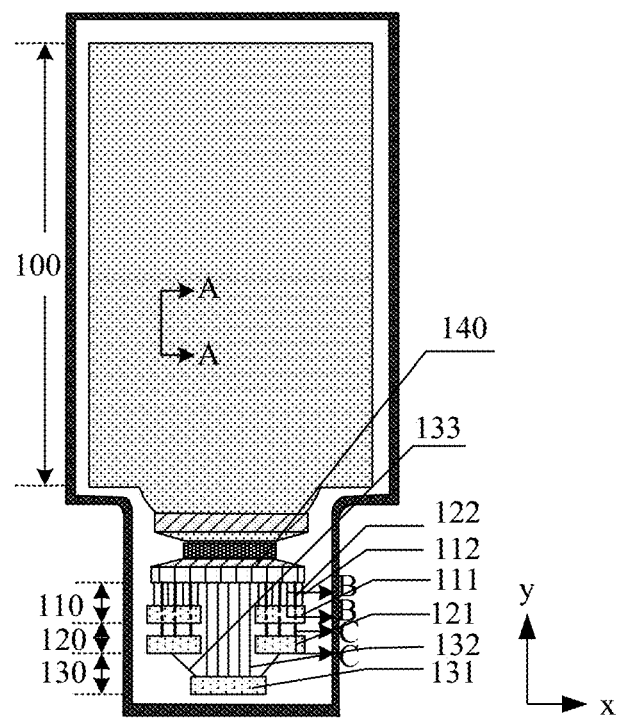
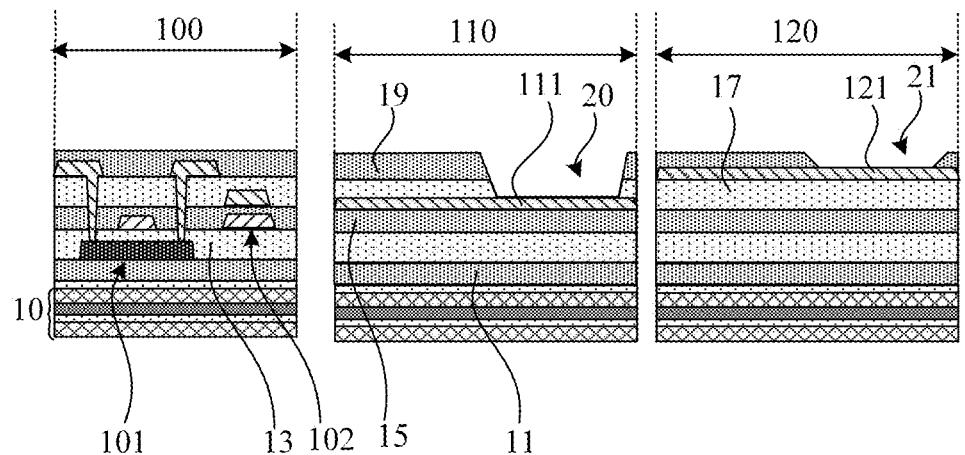

DISPLAY SUBSTRATE AND PREPARATION METHOD THEREFOR, AND DISPLAY DEVICE

CROSS-REFERENCE TO RELATED APPLICATIONS

The present disclosure is a U.S. National Phase Entry of International Application PCT/CN2021/080032 having an international filing date of Mar. 10, 2021, which claims priority of Chinese patent application 202010323194.4, filed on Apr. 22, 2020, and the contents disclosed in the above-mentioned application are hereby incorporated as a part of this application.

TECHNICAL FIELD

The present disclosure relates to, but is not limited to, the field of display technology, and particularly relates to a display substrate and a method for preparing the display substrate, and a display device.

BACKGROUND

As an active light emitting display device, an Organic Light Emitting Diode (OLED) has advantages such as self-luminance, wide viewing angle, high contrast, relatively low power consumption, very quick response, etc. With continuous development of display technology, an OLED technology has been applied to flexible display devices increasingly.

OLEDs are divided according to driving modes into two types, i.e., Passive Matrix Driving OLED (PMOLED) and Active Matrix Driving OLED (AMOLED). AMOLED display devices are expected to replace Liquid Crystal Displays (LCD) as next-generation novel flat panel displays due to their advantages such as low manufacturing costs, quick response, power saving, applicability to direct current driving of portable devices, wide range of working temperatures, etc.

SUMMARY

The following is a summary of the subject matters described in the present disclosure in detail. The summary is not intended to limit the scope of protection of the claims.

The disclosure provides a display substrate. The display substrate includes a flexible base substrate and a display area, a binding pin area, a first unit test electrode and a second unit test electrode which are located at one side of the flexible base substrate. The binding pin area is located at one side of the display area, the first unit test electrode is located at one side of the binding pin area away from the display area, and the second unit test electrode is located at one side of the first unit test electrode away from the binding pin area. The display substrate includes a first metal layer, a second metal layer and an insulating layer located between the first metal layer and the second metal layer, wherein the first unit test electrode is located on the first metal layer and the second unit test electrode is located on the second metal layer.

In some possible implementations, the number of the first unit test electrodes is one or more, and the number of the second unit test electrodes is one or more.

In some possible implementations, the first metal layer further includes multiple first signal lines, one end of each first signal lines is connected with the first unit test electrode, and the other end of the first signal line is connected with the bonding pin area; the second metal layer further includes multiple second signal lines, one end of each second signal line is connected with the second unit test electrode, and the other end of the second signal line is connected with the binding pin area, and an orthographic projection of the first signal lines on the flexible base substrate does not overlap with an orthographic projection of the second signal lines on the flexible base substrate.

In some possible implementations, the first signal lines and the second signal lines are parallel to each other and spaced apart, a width of a first signal line or a second signal line is 45 microns to 75 microns, and a spacing between the first signal line and the second signal line is 45 microns to 75 microns.

In some possible implementations, the display area includes touch control signal lines and data lines; the first unit test electrode is connected to the touch control signal lines through the first signal lines, and the second unit test electrode is connected to the data lines through the second signal lines; or, the first unit test electrode is connected to the data lines through the first signal lines, and the second unit test electrode is connected to the touch control signal lines through the second signal lines.

In some possible implementations, a width of the first unit test electrode is 2500 microns to 7500 microns and a height of the first unit test electrode is 400 microns to 1200 microns, a width of the second unit test electrode is 2500 microns to 7500 microns and a height of the second unit test electrode is 400 microns to 1200 microns, and a distance between the first unit test electrode and the second unit test electrode is 400 microns to 1200 microns.

In some possible implementations, the display area includes a first insulating layer located on the flexible base substrate, an active layer located on the first insulating layer, a second insulating layer covering the active layer, a first gate metal layer located on the second insulating layer, a third insulating layer covering the first gate metal layer, a second gate metal layer located on the third insulating layer, a fourth insulating layer covering the second gate metal layer, a first source-drain metal layer located on the fourth insulating layer, and a fifth insulating layer covering the first source-drain metal layer; the first metal layer is disposed in a same layer as the first gate metal layer, the second metal layer is disposed in a same layer as the second gate metal layer; or, the first metal layer is disposed in a same layer as the second gate metal layer, and the second metal layer is disposed in a same layer as the first source-drain metal layer.

In some possible implementations, the display substrate further includes an array test electrode, which is located at one side of the second unit test electrode away from the first unit test electrode; and the array test electrode is located on the first metal layer or the second metal layer.

In some possible implementations, the display substrate further includes a third signal line, wherein one end of the third signal line is connected with the array test electrode, and the other end of the third signal line is connected with the binding pin area, and the third signal line is disposed in a same layer as the array test electrode.

In some possible implementations, the number of the first unit test electrodes is two, the number of the second unit test electrodes is two, and the third signal line is located between two of the first unit test electrodes and the third signal line is located between the two second unit test electrodes.

In some possible implementations, the display substrate further includes a fourth signal line, wherein one end of the fourth signal line is connected with the array test electrode, and the other end of the fourth signal line is connected with at least one of the first unit test electrode and the second unit test electrode.

The disclosure further provides a display device, which includes the aforementioned display substrate.

The disclosure further provides a method for preparing a display substrate, the method includes: forming a flexible base substrate on a rigid carrier plate; forming a driving structure layer on the flexible base substrate, wherein the driving structure layer includes a first metal layer, a second metal layer and an insulating layer located between the first metal layer and the second metal layer, the first metal layer includes one or more first unit test electrodes, and the second metal layer includes one or more second unit test electrodes; separating the flexible base substrate from the rigid carrier plate.

In some possible implementations, the display substrate includes a display area, and the display area includes: a first insulating layer located on the flexible base substrate, an active layer located on the first insulating layer, a second insulating layer covering the active layer, a first gate metal layer located on the second insulating layer, a third insulating layer covering the first gate metal layer, a second gate metal layer located on the third insulating layer, a fourth insulating layer covering the second gate metal layer, a first source-drain metal layer located on the fourth insulating layer, and a fifth insulating layer covering the first source-drain metal layer; the first metal layer is disposed in the same layer as the first gate metal layer, the second metal layer is disposed in the same layers as the second gate metal layer; alternatively, the first metal layer is disposed in the same layer as the second gate metal layer, the second metal layer is disposed in the same layers as the first source-drain metal layer.

Other aspects will become apparent upon reading and understanding of the description of accompanying drawings and implementation of the present disclosure.

BRIEF DESCRIPTION OF DRAWINGS

FIG. 1 is a schematic structural diagram of a display substrate according to the present disclosure.

FIG. 2 is a schematic sectional view of the display substrate in FIG. 1 taken in AA, BB and CC directions.

Figure 3:
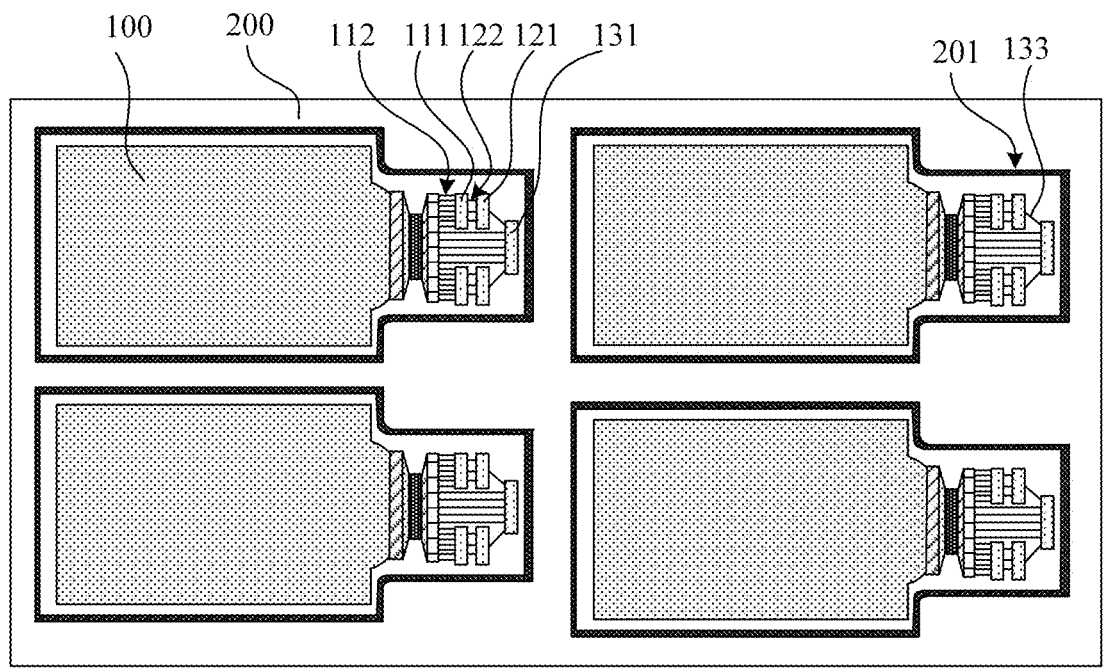
FIG. 3 is a schematic structural diagram of a display mother plate according to the present disclosure.

Description of reference signs in the drawing:

DETAILED DESCRIPTION

In order to make purposes, technical solutions and advantages of the present disclosure more clear and understandable, embodiments of the present disclosure will be described in detail below with reference to accompanying drawings. Implementations may be implemented in various forms. Those skilled in the art may easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and the features in the embodiments can be in arbitrary combination with each other once no conflict exists.

In the drawings, sometimes for sake of clarity, sizes of constituent elements, thickness of a layer or a region may be exaggerated. Therefore, implementations of the present disclosure are not necessarily limited to the sizes, and shapes and magnitudes of the components in the drawings do not reflect real scales. In addition, the drawings schematically show ideal examples, and implementations of the present disclosure are not limited to the shapes or values shown in the drawings.

"First", "second", "third" and other ordinal numerals in this specification are set to avoid confusion between constituent elements, rather than to provide a limitation on quantities.

For convenience, terms indicating orientation or positional relations such as "middle", "up", "down", "front", "rear", "vertical", "horizontal", "top", "bottom", "inside" and "outside" are used to describe positional relations between constituent elements with reference to the drawings in this specification, and are only for the convenience of describing this specification and simplifying the description, instead of indicating or implying that the devices or elements referred to must have a specific orientation or be constructed and operated in a specific orientation, therefore they should not be understood as limitations on the present disclosure. The position relations between the constituent elements may be appropriately varied according to directions according to which the constituent elements are described. Therefore, appropriate replacements may be made based on situations, which are not limited to wordings specified in this specification.

In this specification, unless otherwise specified and limited, the terms "mount", "connected" and "connect" should be understood in a broad sense. For example, a connection may be fixed connection, detachable connection or integrated connection, may be mechanical connection or electrical connection, or may be direct connection, indirect

| 100-Display area; | 110-First unit test area; | 120-Second unit test area; |
| 111-First unit test electrode; | 121-Second unit test electrode; | 131-Array test electrode; |
| 112-First signal line | 122-Second signal line | 132-Third signal line; |
| 130-Array test area; | 200-Cutting region; | 201-Cutting lane; |
| 133-Fourth signal line; | 101-First transistor; | 102-First storage capacitor; |
| 1-Rigid carrier plate; | 10-Flexible base substrate; | 10A-First flexible layer; |
| 10B-First barrier layer; | 10C-Amorphous silicon layer; | 10D-Second flexible layer; |
| 10E-Second barrier layer; | 11-First insulating layer; | 12-First active layer; |
| 13-Second insulating layer; | 14A-First gate electrode; | 14B-First capacitor electrode; |
| 15-Third insulating layer; | 16A-Second capacitor electrode; | 17-Fourth insulating layer; |
| 18A-First source electrode; | 18A-First drain electrode; | 19-Fifth insulating layer; |
| 20-First opening; | 21-Second opening; | 140-Binding pin area; | connection through middleware, or internal communication between two elements. For those skilled in the art, specific meanings of the above terms in the present disclosure can be understood according to specific situations.

In this specification, a transistor refers to an element at least including three terminals, namely a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source electrode. In this specification, the channel region refers to a region which the current mainly flows through.

In this specification, it may be the case that a first electrode is a drain electrode and a second electrode is a source electrode, and it may also be the case that a first electrode is a source electrode and a second electrode is a drain electrode. In cases that transistors with opposite polarities are used, or a current direction changes during operation of a circuit, or the like, functions of the "source electrode" and the "drain electrode" are sometimes be interchangeable. Therefore, the "source electrode" and the "drain electrode" are interchangeable in the present specification.

In the present specification, "connection" includes situations where constituent elements are connected together through an element with certain electrical effect. "The element with certain electrical effect" is not particularly limited as long as electric signals between the connected constituent elements may be sent and received. Examples of "the element with certain electric effect" not only include electrodes and wires, but also include switch elements (such as transistors), resistors, inductors, capacitors and other elements with various functions, etc.

In this specification, "parallel" refers to a state in which an angle formed by two straight lines is above −10° and below 10°. Thereby, it also includes a state in which an angle is above −5° and below 5°. In addition, "perpendicular" refers to a state in which an angle formed by two straight lines is above 80° and below 100°. Therefore, it also includes a state in which an angle is above 85° and below 95°.

In this specification, "film" and "layer" are interchangeable. For example, sometimes "electric conductive layer" may be replaced by "electric conductive film". Similarly, sometimes "insulating film" may be replaced by "insulating layer".

An AMOLED display with a touch control function comes into being based on demands of function diversification, and the AMOLED display includes a touch control structure layer and a display structure layer. The touch control structure layer includes touch control signal lines including multiple driving signal lines Tx and multiple sensing signal lines Rx. The touch control screen signal lines are usually formed in a process stage of a Flexible Multilayer On Cell Touch (FMLOC). Since in the AMOLED display with touch control function, pins for detecting touch control screen signal lines are added in a unit test electrode of a test area, leading to that a length of the unit test electrode is increased to be more than doubled, which further results in that profiled cutting in a unit display panel stage cuts the unit test electrode apart. Therefore, the profiled cutting of the AMOLED display with touch control function must be transferred to and performed in a module (MDL) stage, which requires modification of a module device, resulting in reduction of productivity in the module stage.

At least one embodiment of the present disclosure provides a display substrate, which includes a base substrate and a display area, a binding pin area, a first unit test electrode and a second unit test electrode which are located at one side of the substrate, wherein the binding pin area is located at one side of the display area, the first unit test electrode is located at one side of the binding pin area away from the display area, and the second unit test electrode is located at one side of the first unit test electrode away from the binding pin area. The display substrate includes a first metal layer, a second metal layer and an insulating layer located between the first metal layer and the second metal layer, and the first unit test electrode is located on the first metal layer while the second unit test electrode is located on the second metal layer.

Some embodiments of the present disclosure further provide a display device and a method for preparing the display substrate corresponding to the display substrate described above.

In the display substrate provided by the above-mentioned embodiment of the present disclosure, lengths of the unit test electrodes are shortened by placing the first unit test electrode and the second unit test electrode on the two metal layers respectively, such that the profiled cutting of the AMOLED display with touch control function will not cut the unit test electrode apart in the unit display panel stage, that is, the profiled cutting may still be carried out in the unit display panel stage, thus productivity in the module stage is released and the overall productivity is improved.

As shown in FIG. 1, a display substrate is provided in an embodiment of the present disclosure, the display substrate includes a display area 100, a binding pin area 140, a first unit test area 110 and a second unit test area 120 in a direction parallel to a plane of the display substrate. The binding pin area 140 is located at one side of the display area 100, the first unit test area 110 is located at one side of the binding pin area 140 away from the display area 100, and the second unit test area 120 is located at one side of the first unit test area 110 away from the binding pin area 140. The first unit test area 110 includes one or more first unit test electrodes 111, and the second unit test area 120 includes one or more second unit test electrodes 121.

FIG. 2 is a schematic structural diagram of the display substrate of the present disclosure, which is a sectional view in AA direction, BB direction and CC direction in FIG. 1. As shown in FIG. 2, the display substrate includes a first metal layer, a second metal layer and an insulating layer located between the first metal layer and the second metal layer, wherein the first unit test electrode 111 is located on the first metal layer and the second unit test electrode 121 is located on the second metal layer.

In an exemplary embodiment, the first metal layer further includes multiple first signal lines 112 (not shown in FIG. 2), one end of each first signal line 112 is connected to the first unit test electrode 111, and the other end of the first signal line 112 is connected to the bonding pin region 140. The second metal layer further includes multiple second signal lines 122 (not shown in FIG. 2), one end of each second signal line 122 is connected to the second unit test electrode 121, and the other end of the second signal line 122 is connected to the bonding pin area 140. An orthographic projection of the first signal lines 112 on the flexible base substrate 10 does not overlap with an orthographic projection of the second signal lines 122 on the flexible base substrate 10.

In an exemplary embodiment, the first signal lines 112 and the second signal lines 122 are parallel to each other and spaced apart, a width of a first signal line 112 or a second signal line 122 is 45 microns to 75 microns, and the spacing between the first signal line 112 and the second signal line 122 is 45 microns to 75 microns.

For example, the width of the first signal line 112 may be 60 microns, the width of the second signal line 122 may be 60 microns, and the spacing between the first signal line 112 and the second signal line 122 may be 60 microns.

In an exemplary embodiment, the display area includes touch control signal lines and data lines (not shown in the figures), the first unit test electrode 111 is connected to the touch control signal lines through the first signal lines 112, and the second unit test electrode 121 is connected to the data lines through the second signal lines 122. Alternatively, the first unit test electrode 111 is connected to the data lines through the first signal lines 112, the second unit test electrode 121 is connected to the touch control signal lines through the second signal lines 122. That is, any one of the first unit test electrode 111 and the second unit test electrode 121 may be configured to detect the touch control signal lines, and the other one may be configured to detect a pixel electrode.

In an exemplary embodiment, a width of the first unit test electrode 111 is 2500 microns to 7500 microns and a height of the first unit test electrode 111 is 400 microns to 1200 microns, a width of the second unit test electrode 121 is 2500 microns to 7500 microns and a height of the second unit test electrode 121 is 400 microns to 1200 microns, and a distance between the first unit test electrode 111 and the second unit test electrode 121 is 400 microns to 1200 microns. In this embodiment, as shown in FIG. 1, the width of the first unit test electrode 111 or the second unit test electrode 121 refers to a length of the first unit test electrode 111 or the second unit test electrode 121 in the x direction, and the height of the first unit test electrode 111 or the second unit test electrode 121 refers to a length of the first unit test electrode 111 or the second unit test electrode 121 in the y direction.

For example, the first unit test electrode 111 may have a width of 5000 microns and a height of 750 microns, the second unit test electrode 121 may have a width of 5000 microns and a height of 750 microns, and the distance between the first unit test electrode 111 and the second unit test electrode 121 may be 750 microns.

In an exemplary embodiment, the display area 100 includes a first insulating layer 11 located on the flexible base substrate 10, an active layer located on the first insulating layer 11, a second insulating layer 13 covering the active layer, a first gate metal layer located on the second insulating layer 13, a third insulating layer 15 covering the first gate metal layer, a second gate metal layer located on the third insulating layer 15, a fourth insulating layer 17 covering the second gate metal layer, a first source-drain metal layer located on the fourth insulating layer 17, a fifth insulating layer 19 covering the first source-drain metal layer.

The first metal layer may be disposed in a same layer as the first gate metal layer, and the second metal layer may be disposed in a same layer as the second gate metal layer. Alternatively, the first metal layer may be disposed in a same layer as the second gate metal layer, and the second metal layer may be disposed in a same layer as the first source-drain metal layer.

In an exemplary embodiment, as shown in FIG. 1, the display substrate may further include an array test area 130, wherein the array test area 130 may be located at one side of the second unit test area 120 away from the display area 100.

The array test area 130 includes an array test electrode 131, and the array test electrodes 131 may be located on the first metal layer or the second metal layer.

In an exemplary embodiment, the array test area 130 may further include a third signal line 132, wherein one end of the third signal line 132 is connected to the array test electrode 131, and the other end of the third signal line 132 is connected to the bonding pin area 140. The third signal line 132 is disposed in a same layer as the array test electrode 131. The array test electrode 131 is configured to test the display substrate to check whether there is a existing problem such as short circuit an open circuit, or the like.

In an exemplary embodiment, the number of the first unit test electrodes 111 is two, the number of the second unit test electrodes 121 is two, and the third signal line 132 is located between the two first unit test electrodes 111 and the third signal line 132 is located between the two second unit test electrodes 121.

In an exemplary embodiment, the array test area 130 may further include a fourth signal line 133, wherein one end of the fourth signal line 133 is connected to the array test electrode 131, and the other end of the fourth signal line 133 is connected to at least one of the first unit test electrode 111 and the second unit test electrode 121. With arrangement of the fourth signal line 133, a unit related to unit test may be turned off during an array test or a unit related to array test may be turned off during a unit test.

A structure of a display substrate according to the present disclosure is described below by an example of a preparation process of a display substrate. A "patterning process" mentioned in the present disclosure includes film layer deposition, photoresist coating, masking exposure, development, etching, photoresist stripping, and other treatment. The deposition may be selected from any one or more of sputtering, evaporation, and chemical vapor deposition. The coating may selected from be any one or more of spray coating and spin coating. The etching may be selected from any one or more of dry etching and wet etching. A "thin film" refers to a layer of thin film made from a certain material on a substrate utilizing a deposition or coating process. If a patterning process is not needed by the "thin film" in the whole manufacturing process, the "thin film" may also be called a "layer". When the patterning process is further needed by the "thin film" in the whole manufacturing process, the thin film is called a "thin film" before the patterning process and called a "layer" after the patterning process. The "layer" after the patterning process includes at least one "pattern". In the present disclosure, "A is disposed in the same layer as B" refers to that A and B are formed at the same time by the same patterning process. "The orthographic projection of A contains the orthographic projection of B" refers to that the orthographic projection of B falls in a range of the orthographic projection of A or the orthographic projection of A covers the orthographic projection of B.

Since in the preparation process of the display substrate according to the present disclosure, a display mother plate is first prepared, and then the display mother plate is cut into multiple display substrates, therefore in the following description, the substrate before the cutting is called the display mother plate and the substrate after the cutting is called the display substrate. As shown in FIG. 3, the display mother plate includes a substrate region and a cutting region 200 located at a periphery of the substrate region. The substrate region includes a display area 100, a binding pin area 140, a first unit test area 110 and a second unit test area 120.

Figure 4:
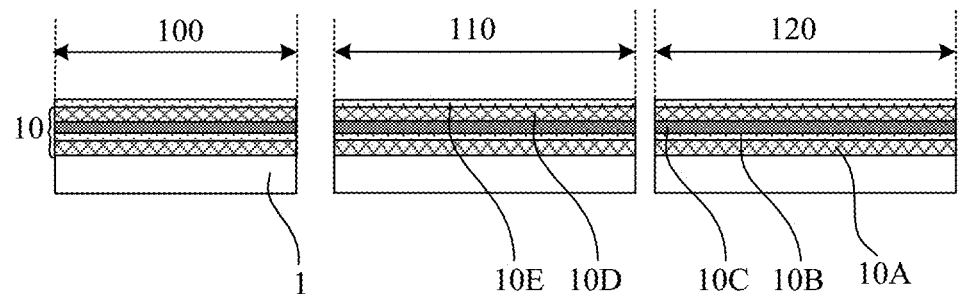
FIG. 4 is a schematic diagram of a structure after a flexible base substrate is formed according to the present disclosure.

(1) A flexible base substrate 10 is prepared on a rigid carrier plate 1. In the present disclosure, the flexible base substrate 10 includes a first flexible material layer, a first inorganic material layer, a semiconductor layer, a second flexible material layer and a second inorganic material layer stacked on the rigid carrier plate 1. Materials of the first and second flexible material layers may include polyimide (PI), polyethylene terephthalate (PET) or polymer soft film after surface treatment, and materials of the first and second inorganic material layers may include silicon nitride (SiNx) or silicon oxide (SiOx) to improve anti-water-oxygen capability of the substrate. The first and second inorganic material layers may also be called barrier layers, and amorphous silicon (a-si) may be used as a material of the semiconductor layer. In an exemplary embodiment, taking a laminated structure PI1/Barrier1/a-si/PI2/Barrier2 as an example, the preparation process of the flexible base substrate 10 may include: first coating a layer of polyimide on the rigid carrier plate 1, and then forming a first flexible (PI1) layer 10A after the polyimide is cured and formed as a film; then, depositing a layer of barrier thin film on the first flexible layer 10A to form a first barrier (Barrier1) layer 10B covering the first flexible layer 10A; then, depositing a layer of amorphous silicon thin film on the first barrier layer 10B to form an amorphous silicon (a-si) layer 10C covering the first barrier layer 10B; then, coating a layer of polyimide on the amorphous silicon layer 10C, and forming a second flexible (PI2) layer 10D after the polyimide is cured and formed as a film; then, depositing a layer of barrier thin film on the second flexible layer 10D to form a second barrier (Barrier2) layer 10E covering the second flexible layer 10D, thus completing the preparation of the flexible base substrate 10, as shown in FIG. 4. After this process, the display area 100, the first unit test area 110 and the second unit test area 120 all include the flexible base substrate 10.

(2) A pattern of a driving structure layer is prepared on the flexible base substrate 10. The driving structure layer of the display area 100 includes a first transistor 101 and a first storage capacitor 102 which form a pixel driving circuit. The driving structure layer of the first unit test area 110 includes a first unit test electrode 111, a first signal line 112 and a second signal line 122, and the driving structure layer of the second unit test area 120 includes a second unit test electrode 121 and a second signal line 122. In this embodiment, the second signal line 122 passes through the first unit test area 110 to be connected with the binding pin area 140. In an exemplary embodiment, the preparation process of the driving structure layer may include:

a first insulating thin film and an active layer thin film are sequentially deposited on the flexible base substrate 10, the active layer thin film is patterned by a patterning process to form a first insulating layer 11 covering the entire flexible base substrate 10 and a pattern of an active layer located on the first insulating layer 11, wherein the pattern of the active layer, which at least includes a first active layer 12A, is formed in the display area. After this patterning process, the first unit test area 110 and the second unit test area 120 include the first insulating layer 11 located on the flexible base substrate 10.

Then, a second insulating thin film and a first metal thin film are sequentially deposited and the first metal thin film is patterned by a patterning process to form a second insulating layer 13 covering the pattern of the active layer and a pattern of a first gate metal layer located on the second insulating layer 13, and the pattern of the first gate metal layer, which at least includes a first gate electrode 14A and a first capacitor electrode 14B, is formed in the display area 100. After this patterning process, the first unit test area 110 and the second unite test area 120 includes the first insulating layer 11 and the second insulating layer 13 stacked on the flexible base substrate 10.

Then, a third insulating thin film and a second metal thin film are sequentially deposited and the second metal thin film is patterned by a patterning process to form a third insulating layer 15 covering the first gate metal layer and a pattern of a second gate metal layer located on the third insulating layer 15, and the pattern of the second gate metal layer, which at least includes a second capacitor electrode 16A, is formed in the display area 100, wherein a position of second capacitor electrode 16A corresponds to that of the first capacitor electrode 14B. The first metal layer is formed in the first unit test area 110, and at least includes the first signal line 112 and a pattern of the first unit test electrode 111. The first signal line 112 is configured to connect the first unit test electrode 111 with the binding pin area 140. After this patterning process, the bonding area 120 includes the first insulating layer 11, the second insulating layer 13 and the third insulating layer 15 which are stacked on the flexible base substrate 10.

Then, a fourth insulating thin film is deposited, the fourth insulating thin film is patterned by a patterning process to form a pattern of a fourth insulating layer covering the second gate metal layer, wherein the fourth insulating layer 17 is provided with multiple first vias which are formed in the display area 100. Positions of the multiple first vias correspond to positions of two ends of the first active layer, respectively. The fourth insulating layer 17, the third insulating layer 15 and the second insulating layer 13 in the multiple first vias are etched away to expose a surface of the first active layer 12A, respectively. After this patterning process, the first unit test area 110 includes the first insulating layer 11, the second insulating layer 13, the third insulating layer 15 and the fourth insulating layer 17 which are stacked on the flexible base substrate 10. The second unit test area 120 includes the first insulating layer 11, the second insulating layer 13, the third insulating layer 15 and the fourth insulating layer 17 which are stacked on the flexible base substrate 10.

Then, a third metal thin film is deposited, and the third metal thin film is patterned by a patterning process to form a pattern of a source-drain metal layer and a pattern of a second metal layer on the fourth insulating layer 17. The source-drain metal layer, which at least includes the pattern of a first source electrode 18A, a first drain electrode 18B and multiple data lines(not shown), is formed in the display area 100. The first source electrode 18A and the first drain electrode 18B are connected with the first active layer 12A through the first vias, respectively. In an exemplary embodiment, the source-drain metal layer may further include any one or more of a power supply line (VDD), a compensation line, and an auxiliary cathode according to actual needs. The source-drain metal layer is also called a first source-drain metal layer (SD1). The second metal layer at least includes the pattern of the second unit test electrode 121 and the second signal line 122, wherein the second signal line 122 is simultaneously formed in the first unit test area 110 and the second unit test area 120, the second unit test electrode 121 is formed in the second unit test area 120, and the second signal line 122 is used for connecting the second unit test electrode 121 with the binding pin area 140. An orthographic projection of the first signal line 112 on the flexible base substrate 10 does not overlap with an orthographic projection of the second signal line 112 on the flexible base substrate 10. In an exemplary embodiment, the first signal line 112 and the second signal line 122 are parallel to each other and spaced apart, a width of the first signal line 112 or the second signal line 122 is 45 microns to 75 microns, and a spacing between the first signal line 112 and the second signal line 122 is 45 microns to 75 microns.

In an exemplary embodiment, the first unit test electrode 111 has a width of 2500 microns to 7500 microns and a height of 400 microns to 1200 microns, the second unit test electrode 121 has a width of 2500 microns to 7500 microns and a height of 400 microns to 1200 microns, wherein a distance between the first unit test electrode 111 and the second unit test electrode 121 is 400 microns to 1200 microns. In this embodiment, as shown in FIG. 1, the width of the first unit test electrode 111 or the second unit test electrode 121 refers to a length of the first unit test electrode 111 or the second unit test electrode 121 in the x direction, and the height of the first unit test electrode 111 or the second unit test electrode 121 refers to a length of the first unit test electrode 111 or the second unit test electrode 121 in the y direction.

Then, a fifth insulating thin film is deposited to form a pattern of a fifth insulating layer 19 covering the source-drain metal layer.

Figure 5:
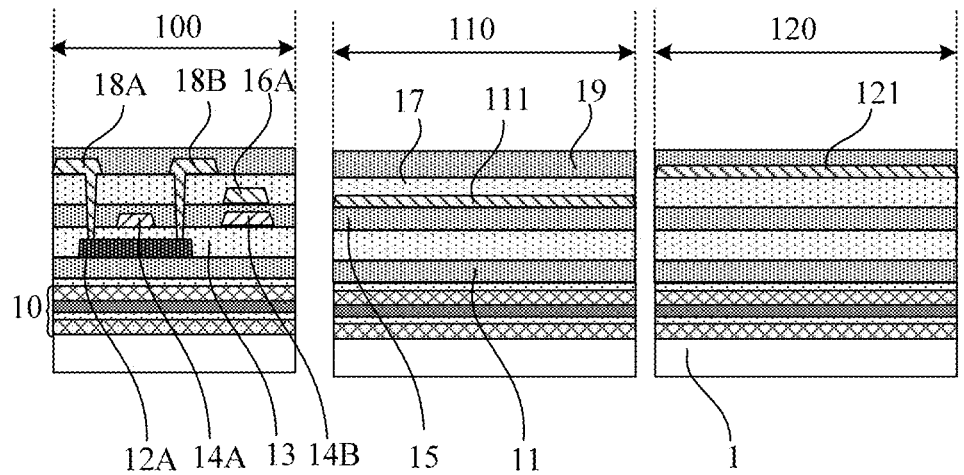
FIG. 5 is a schematic diagram of a structure after a pattern of a driving structure layer is formed according to the present disclosure.

At this point, the pattern of the driving structure layer is prepared on the flexible base substrate 10, which is as shown in FIG. 5. The driving structure layer of the display area 100 includes: a first insulating layer 11 located on the flexible base substrate 10, an active layer located on the first insulating layer 11, a second insulating layer 13 covering the active layer, a first gate metal layer located on the second insulating layer 13, a third insulating layer 15 covering the first gate metal layer, a second gate metal layer located on the third insulating layer 15, a fourth insulating layer 17 covering the second gate metal layer, a source-drain metal layer located on the fourth insulating layer 17 and a fifth insulating layer 19 covering the source-drain metal layer. The active layer at least includes a first active layer 12A, the first gate metal layer at least includes a first gate electrode 14A and a first capacitor electrode 14B, the second gate metal layer at least includes a second capacitor electrode 16A, and the source-drain metal layer at least includes a first source electrode 18A and a first drain electrode 18B; and the first active layer 12A, the first gate electrode 14A, the first source electrode 18A and the first drain electrode 18B form a first transistor 101, and the first capacitor electrode 14B and the second capacitor electrode 16A form the first storage capacitor 102. In an exemplary embodiment, the first transistor 101 may be a drive transistor in a pixel drive circuit, and the drive transistor may be a Thin Film Transistor (TFT).

The driving structure layer of the first unit test area 110 includes a first insulating layer 11, a second insulating layer 13 and a third insulating layer 15 stacked on the flexible base substrate 10 in sequence, a first metal layer located on the third insulating layer 15, a fourth insulating layer 17 covering the first metal layer, a second metal layer located on the fourth insulating layer 17 and a fifth insulating layer 19 covering the second metal layer.

The driving structure layer of the second unit test area 120 includes a first insulating layer 11, a second insulating layer 13, a third insulating layer 15 and a fourth insulating layer 17 stacked on the flexible base substrate 10 in sequence, a second metal layer located on the fourth insulating layer 17, and a fifth insulating layer 19 covering the second metal layer.

Figure 6:
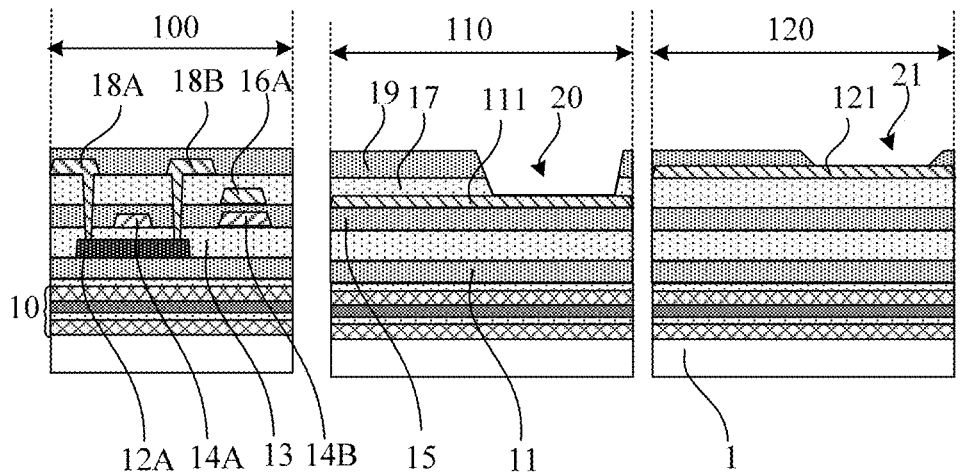
FIG. 6 is a schematic diagram of a structure after a first opening and a second opening is formed according to the present disclosure.

(3) Multiple first openings 20 and second openings 21 are formed in the fifth insulating layer 19. The multiple first openings 20 are formed in the first unit test area 110, and positions of the first openings 20 correspond to the positions of the first unit test electrodes 111, respectively. The fourth insulating layer 16 within the first openings 20 is etched away to expose surfaces of the first unit test electrodes 111, respectively. The multiple second openings 21 are formed in the second unit test area 120, positions of second openings 21 correspond to the positions of the second unit test electrodes 121, respectively, such that surfaces of the second unit test electrodes 121 are exposed, respectively, as shown in FIG. 6.

After the above-mentioned film structures are prepared, a first planarization layer, a second source-drain metal layer, a second planarization layer, a pixel definition layer, an organic light-emitting layer, a cathode and an encapsulation layer are formed in sequence in the display area 100. Then, the display mother plate is stripped off from the rigid carrier plate 1 by a stripping process, and then a layer of back film is attached to the back face of the display mother plate (a surface of the flexible base substrate 10 away from the film layers) by roller attaching, such that the preparation of the display mother plate is completed. Subsequently, a cutting equipment cuts along a cutting lane 201 to divide the display mother plate into the display substrate of present disclosure. After the cutting is completed, a cutting region 200 is cut off, as shown in FIG. 1.

In another exemplary embodiment, a region of the display substrate may further include a temporary protect film (TPF), which is attached to the encapsulation layer, and is used for protecting the film layer structure of the display substrate. The operation of attaching the back film is performed after the protective film is attached. After the cutting is completed, the protective film is removed first, and then a touch control layer and a cover plate are disposed on the encapsulation layer in sequence to form a touch control display panel.

In the present disclosure, the first insulating thin film, the second insulating thin film, the third insulating thin film, the fourth insulating thin film and the fifth insulating thin film may be made of any one or more of silicon oxide (SiOx), silicon nitride (SiNx) and silicon oxynitride (SiON), and may be a single layer, multiple layers or a composite layer. The first insulating layer is called a buffer layer used for improving the anti-water-oxygen capability of the base substrate, the second insulating layer and the third insulating layer are called gate insulating (GI) layers, the fourth insulating layer is called an interlayer dielectric (ILD) layer, and the fifth insulating layer is called a passivation (PVX) layer. The first planarization layer and the second planarization layer may be made of an organic material. The first metal thin film, the second metal thin film, the third metal thin film and the fourth metal thin film may be made of a metal material, such as any one or more of silver (Ag), copper (Cu), aluminum (Al) and molybdenum (Mo), or an alloy material of the above metals, such as AlNd alloy or MoNb alloy, which may have a single-layer structure or a multi-layer composite structure, such as Mo/Cu/Mo. The cathode may be made of any one or more of Magnesium (Mg), Argentum (Ag), Aluminum (Al), Copper (Cu), and Lithium (Li), or an alloy made of any one or more of the abovementioned metals. The active layer thin film may be made of an amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene and other materials, that is, the present disclosure is applicable to transistors manufactured based on oxide technology, silicon technology and organic matter technology. The transparent conductive thin film may employ indium tin oxide (ITO) or indium zinc oxide (IZO), and the pixel definition layer may be made of polyimide, acrylic or polyethylene terephthalate, etc.

It may be seen from the structure of the display substrate and the preparation process thereof that in the embodiment of the present disclosure, the first unit test electrode 111 and the second unit test electrode 121 are respectively located on two metal layers, which shortens the lengths of the unit test electrodes, such that the profiled cutting of the AMOLED display with touch control function will not cut the unit test electrodes in the unit display panel stage, that is, the profiled cutting can still be carried out in the unit display panel stage, thus releasing the productivity in the module stage and improving the overall productivity.

The structure shown in the present disclosure and the preparation process thereof are merely an exemplary description. In an exemplary implementation, corresponding structures may be changed and patterning processes may be added or reduced according to specific requirements. For example, in this example, the first metal layer is disposed in the same layer as the second gate metal lay, and the second metal layer is disposed in the same layer as the first source-drain metal layer. In other examples, the first metal layer may be disposed in the same layer as the first gate metal layer, and the second metal layer may be disposed in the same layer as the second gate metal layer; alternatively, the first metal layer may be disposed in the same layer as the first source-drain metal layer, and the second metal layer may be disposed in the same layer as the second source-drain metal layer. The present disclosure is not specifically limited thereto.

Figure 7:
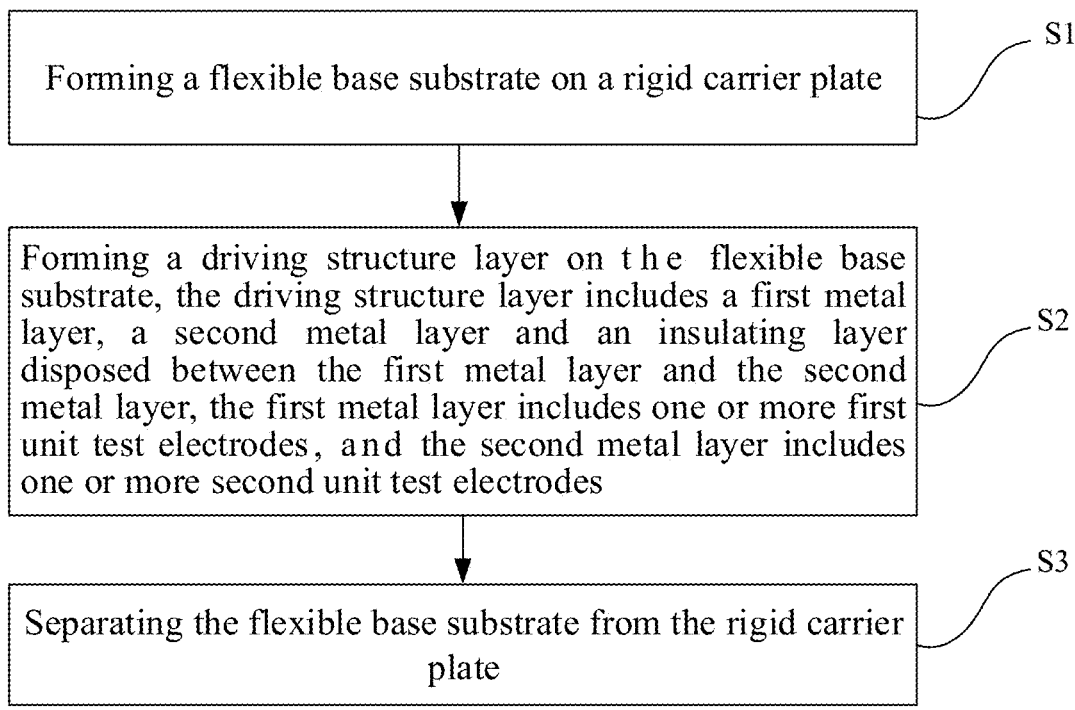
FIG. 7 illustrates a schematic flowchart of a method for preparing a display substrate according to the present disclosure.

The present disclosure further provides a method for preparing the display substrate, as shown in FIG. 7, which includes steps S1 to S3.

Among them, Step S1 includes: forming a flexible base substrate on a rigid carrier plate.

Step S2 includes: forming a driving structure layer on the flexible base substrate, wherein the driving structure layer includes a first metal layer, a second metal layer and an insulating layer located between the first metal layer and the second metal layer, wherein the first metal layer includes one or more first unit test electrodes, and the second metal layer includes one or more second unit test electrodes.

In an exemplary embodiment, the first metal layer further includes multiple first signal lines, wherein one end of each first signal line is connected with the first unit test electrode, and the other end of the first signal line is connected with a bonding pin area. The second metal layer further includes multiple second signal lines, wherein one end of each second signal line is connected with the second unit test electrode, and the other end of the second signal line is connected with the binding pin area. An orthographic projection of the first signal lines on the flexible base substrate does not overlap with an orthographic projection of the second signal lines on the flexible base substrate.

In an exemplary embodiment, the first signal lines 112 and the second signal lines 122 are parallel to each other and spaced apart, a width of a first signal line 112 or a second signal line 122 is 45 microns to 75 microns, and the spacing between the first signal line 112 and the second signal line 122 is 45 microns to 75 microns.

For example, the width of the first signal line 112 may be 60 microns, the width of the second signal line 122 may be 60 microns, and a spacing between the first signal line 112 and the second signal line 122 may be 60 microns.

In an exemplary embodiment, the first unit test electrode 111 has a width of 2500 microns to 7500 microns and a height of 400 microns to 1200 microns, the second unit test electrode 121 has a width of 2500 microns to 7500 microns and a height of 400 microns to 1200 microns, and a distance between the first unit test electrode 111 and the second unit test electrode 121 is 400 microns to 1200 microns. In this embodiment, the width of the first unit test electrode 111 or the second unit test electrode 121 refers to a length of the first unit test electrode 111 or the second unit test electrode 121 in the x direction, and a height of the first unit test electrode 111 or the second unit test electrode 121 refers to a length of the first unit test electrode 111 or the second unit test electrode 121 in the y direction.

For example, the first unit test electrode 111 may have a width of 5000 microns and a height of 750 microns, the second unit test electrode 121 may have a width of 5000 microns and a height of 750 microns, and the distance between the first unit test electrode 111 and the second unit test electrode 121 may be 750 microns.

In an exemplary embodiment, the display substrate includes the display area, which includes a first insulating layer located on the flexible base substrate, an active layer located on the first insulating layer, a second insulating layer covering the active layer, a first gate metal layer located on the second insulating layer, a third insulating layer covering the first gate metal layer, a second gate metal layer located on the third insulating layer, a fourth insulating layer covering the second gate metal layer, a first source-drain metal layer located on the fourth insulating layer, a fifth insulating layer covering the first source-drain metal layer.

The first metal layer may be disposed in a same layer as the first gate metal layer, and the second metal layer may be disposed in a same layer as the second gate metal layer. Alternatively, the first metal layer may be disposed in a same layer as the second gate metal layer, and the second metal layer may be disposed in a same layer as the first source-drain metal layer.

Step S3 includes: separating the flexible base substrate from the rigid carrier plate.

The present disclosure further provides a display device including the display substrate in the aforementioned embodiments. The display device may be: a mobile phone, a tablet computer, a television, a display, a laptop computer, a digital photo frame, a navigator and any products or components with a display function.

The drawings in the present application are only related to the structures involved in the present disclosure, and general designs may be referred to for other structures. The embodiments in the present disclosure, i.e., the features in the embodiments, can be combined with each other to obtain new embodiments if there is no conflict.

It is to be understood by those ordinarily skilled in the art that modifications or equivalent replacements may be made to the technical solutions of the present disclosure without departing from the spirit and scope of the technical solutions of the present disclosure, which, however, should be all included in the scope of the claims of the present application.

The invention claimed is:

1. A display substrate, comprising a flexible base substrate and a display area, a binding pin area, a first unit test electrode and a second unit test electrode which are located at one side of the flexible base substrate, wherein the binding pin area is located at one side of the display area, the first unit test electrode is located at one side of the binding pin area away from the display area, and the second unit test electrode is located at one side of the first unit test electrode away from the binding pin area; and the display substrate comprises a first metal layer, a second metal layer and an insulating layer located between the first metal layer and the second metal layer, wherein the first unit test electrode is located on the first metal layer and the second unit test electrode is located on the second metal layer;

wherein the display area comprises a first insulating layer located on the flexible base substrate, an active layer located on the first insulating layer, a second insulating layer covering the active layer, a first gate metal layer located on the second insulating layer, a third insulating layer covering the first gate metal layer, a second gate metal layer located on the third insulating layer, a fourth insulating layer covering the second gate metal layer, a first source-drain metal layer located on the fourth insulating layer, and a fifth insulating layer covering the first source-drain metal layer; and the first metal layer is disposed in a same layer as the first gate metal layer, and the second metal layer is disposed in a same layer as the second gate metal layer; or, the first metal layer is disposed in a same layer as the second gate metal layer, and the second metal layer is disposed in a same layer as the first source-drain metal layer.

2. The display substrate of claim 1, wherein the number of the first unit test electrode is one or more, and the number of the second unit test electrode is one or more.

3. The display substrate of claim 1, wherein the first metal layer further comprises a plurality of first signal lines, one end of a first signal line is connected to the first unit test electrode and the other end of the first signal line is connected to the binding pin area; the second metal layer further comprises multiple second signal lines, one end of a second signal line is connected to the second unit test electrode, and the other end of the second signal lines is connected to the binding pin area, and an orthographic projection of the first signal lines on the flexible base substrate does not overlap with an orthographic projection of the second signal lines on the flexible base substrate.

4. The display substrate of claim 3, wherein the first signal lines and the second signal lines are parallel to each other and spaced apart, a width of a first signal line or a second signal line is 45 microns to 75 microns, and a spacing between the first signal line and the second signal line is 45 microns to 75 microns.

5. The display substrate of claim 3, wherein the display area comprises touch control signal lines and data lines;

the first unit test electrode is connected to the touch control signal lines through the first signal lines, and the second unit test electrode is connected to the data lines through the second signal lines; or the first unit test electrode is connected to the data lines through the first signal lines, and the second unit test electrode is connected to the touch control signal lines through the second signal lines.

6. The display substrate of claim 1, wherein a width of the first unit test electrode is 2500 microns to 7500 microns and a height of the first unit test electrode is 400 microns to 1200 microns, a width of the second unit test electrode is 2500 microns to 7500 microns and a height of the second unit test electrode is 400 microns to 1200 microns, and a distance between the first unit test electrode and the second unit test electrode is 400 microns to 1200 microns.

7. The display substrate of claim 1, further comprising an array test electrode, wherein the array test electrode is located at one side of the second unit test electrode away from the first unit test electrode; and the array test electrode is located on the first metal layer or the second metal layer.

8. The display substrate of claim 7, further comprising a third signal line, wherein one end of the third signal line is connected to the array test electrode and the other end of the third signal line is connected to the binding pin area, and the third signal line is disposed in a same layer as the array test electrode.

9. The display substrate of claim 8, wherein the number of the first unit test electrodes is two, the number of the second unit test electrodes is two, the third signal line is located between two of the first unit test electrodes, and the third signal line is located between the two second unit test electrodes.

10. The display substrate of claim 7, further comprising a fourth signal line, wherein one end of the fourth signal line is connected to the array test electrode, and the other end of the fourth signal line is connected to at least one of the first unit test electrode and the second unit test electrode.

11. A display device, comprising the display substrate of claim 1.

12. A method for a preparing a display substrate, comprising:

forming a flexible base substrate on a rigid carrier plate;

forming a driving structure layer on the flexible base substrate, wherein the driving structure layer comprises a first metal layer, a second metal layer and an insulating layer located between the first metal layer and the second metal layer, the first metal layer comprises one or more first unit test electrodes, and the second metal layer comprises one or more second unit test electrodes; and separating the flexible base substrate from the rigid carrier plate;

wherein the display substrate comprises a display area, and the display area comprises a first insulating layer located on the flexible base substrate, an active layer located on the first insulating layer, a second insulating layer covering the active layer, a first gate metal layer located on the second insulating layer, a third insulating layer covering the first gate metal layer, a second gate metal layer located on the third insulating layer, a fourth insulating layer covering the second gate metal layer, a first source-drain metal layer located on the fourth insulating layer, and a fifth insulating layer covering the first source-drain metal layer;

the first metal layer is disposed in a same layer as the first gate metal layer, and the second metal layer is disposed in a same layer as the second gate metal layer; or, the first metal layer is disposed in a same layer as the second gate metal layer, and the second metal layer is disposed in a same layer as the first source-drain metal layer.

* * * * *